United States Patent
Wippler

(10) Patent No.: US 11,540,423 B2
(45) Date of Patent: Dec. 27, 2022

(54) WIRELESS CHARGING PAD WITH EVAPORATIVE COOLING

(71) Applicant: Toyota Motor Engineering & Manufacturing North America, Inc., Plano, TX (US)

(72) Inventor: Erik A. Wippler, Canton, MI (US)

(73) Assignee: TOYOTA MOTOR ENGINEERING & MAUFACTURING NORTH AMERICAN, INC., Plano, TX (US)

( * ) Notice: Subject to any disclaimer, the term of this patent is extended or adjusted under 35 U.S.C. 154(b) by 377 days.

(21) Appl. No.: 16/798,156

(22) Filed: Feb. 21, 2020

(65) Prior Publication Data
US 2021/0267098 A1    Aug. 26, 2021

(51) Int. Cl.
| | |
|---|---|
| H05K 7/20 | (2006.01) |
| B60H 1/00 | (2006.01) |
| F28D 5/02 | (2006.01) |
| H02J 7/02 | (2016.01) |

(52) U.S. Cl.
CPC ....... *H05K 7/20881* (2013.01); *B60H 1/0025* (2013.01); *B60H 1/00278* (2013.01); *F28D 5/02* (2013.01); *H02J 7/02* (2013.01); *H05K 7/20209* (2013.01); *H05K 7/20381* (2013.01); *H05K 7/20863* (2013.01)

(58) Field of Classification Search
CPC ............ B60H 1/0025; B60H 2001/003; H05K 7/20209; H05K 7/20863; H02J 7/00309; H02J 50/10; F28D 2021/0029
See application file for complete search history.

(56) References Cited

U.S. PATENT DOCUMENTS

| | | | |
|---|---|---|---|
| 6,282,906 B1 | 9/2001 | Cauchy | |
| 6,732,534 B2 | 5/2004 | Spry | |
| 8,826,830 B2 | 9/2014 | Pajic | |
| 8,947,047 B2 | 2/2015 | Partovi et al. | |
| 9,356,466 B2 | 5/2016 | Han et al. | |

(Continued)

FOREIGN PATENT DOCUMENTS

| | | | |
|---|---|---|---|
| CN | 207426771 U | * | 5/2018 |
| DE | 102018201300 A1 | | 7/2017 |
| KR | 2017084567 A | | 8/2019 |

OTHER PUBLICATIONS

Wikipedia, "Thermoelectric cooling", Jul. 2015, https://en.wikipedia.org/wiki/Thermoelectric_cooling.

*Primary Examiner* — Lionel Nouketcha
(74) *Attorney, Agent, or Firm* — Snell & Wilmer LLP

(57) ABSTRACT

Methods, systems, devices and apparatuses for a charging apparatus for a vehicle. The charging apparatus includes a first sensor configured to measure or detect a temperature of the electronic device. The charging apparatus includes at least one of a blower, a bypass valve or a vent configured to adjust the temperature of the electronic device or a surface of a charging pad. The charging apparatus includes a processor coupled to the first sensor and the at least one of the blower, the bypass valve or the vent. The processor is configured to determine that the temperature of the electronic device exceeds a first threshold temperature. The processor is configured to control the at least one of the blower, the bypass valve or the vent to increase or decrease the temperature of the electronic device or the surface of the charging pad.

20 Claims, 6 Drawing Sheets

(56) References Cited

U.S. PATENT DOCUMENTS

| | | | |
|---|---|---|---|
| 9,604,565 B2 | 3/2017 | Prasad et al. | |
| 9,698,623 B2 | 7/2017 | Adams et al. | |
| 10,219,407 B2 | 2/2019 | Lofy et al. | |
| 10,286,862 B2 | 5/2019 | Pkie et al. | |
| 10,334,752 B2 | 6/2019 | Shin et al. | |
| 2007/0152633 A1 | 7/2007 | Lee | |
| 2011/0056215 A1 | 3/2011 | Ham et al. | |
| 2013/0234656 A1* | 9/2013 | Lambert | H02J 7/0042 320/108 |
| 2016/0181849 A1* | 6/2016 | Govindaraj | H02J 50/40 320/108 |
| 2018/0224909 A1* | 8/2018 | Koo | H02J 50/10 |
| 2019/0261535 A1* | 8/2019 | Lofy | H05K 7/20845 |

\* cited by examiner

WIRELESS CHARGING PAD WITH EVAPORATIVE COOLING

BACKGROUND

Field

This disclosure relates to a system, method, apparatus and/or device for temperature management of a charging pad.

Description of the Related Art

The demand for wireless charging in consumer products continues to increase. Current wireless chargers charge at around 5 W and at approximately 50% efficiency. Newer wireless devices, such as smartphones, however, are able to charge at much greater rates, such as approximately 10 W-15 W. When these newer wireless devices charge at these higher rates between approximately 10 W-15 W, the batteries of these wireless devices increase in temperature. Moreover, these wireless devices are sometimes left to rest in a charger tray or bin for upwards of 2 hours depending on the size and state of charge of the battery. Charging the wireless devices for this length of time can cause excessive heat buildup in the wireless charger and/or the wireless device. Additionally, charging at high (above 10 Watts) power levels speed up the charging but also cause the wireless device to overheat.

Consequently, some consumer products limit the rate of charge or deactivate charging altogether when the temperature reaches a threshold amount to prevent overheating and/or injury to the customer. This, however, decreases the efficiency of charging the consumer product, causes user dissatisfaction and increases the amount of time necessary to charge the consumer product.

Accordingly, there is a need for a system, apparatus and/or method to control the temperature of the device that is charging to increase the overall charging efficiency.

SUMMARY

In general, one aspect of the subject matter described in this disclosure may be embodied in a charging apparatus for charging an electronic device within a vehicle. The charging apparatus includes a first sensor configured to measure or detect a temperature of the electronic device. The charging apparatus includes at least one of a blower, a bypass valve or a vent configured to adjust the temperature of the electronic device or a surface of a charging pad. The charging apparatus includes a processor coupled to the first sensor and the at least one of the blower, the bypass valve or the vent. The processor is configured to determine that the temperature of the electronic device exceeds a first threshold temperature. The processor is configured to control the at least one of the blower, the bypass valve or the vent to increase or decrease the temperature of the electronic device or the surface of the charging pad.

These and other embodiments may optionally include one or more of the following features. The processor may be configured to determine that the temperature of the electronic device is greater than or equal to the first threshold temperature. The at least one of the blower, the bypass valve or the vent may include the blower. The processor may be configured to activate the blower to circulate or move air, liquid or other gases through one or more pipes within or below the surface of the charging pad to decrease the temperature of the electronic device or the surface of the charging pad.

The at least one of the blower, the bypass valve or the vent may include the bypass valve. The bypass valve may be connected to a heating, ventilation, and air conditioning (HVAC) unit of the vehicle. The processor may be configured to open the bypass valve to circulate air or refrigerant from the HVAC unit through the one or more pipes within or below the surface of the charging pad to decrease the temperature of the electronic device or the surface of the charging pad. The processor may be configured to decrease the temperature of the electronic device or the surface of the charging pad when the temperature of the electronic device is greater than or equal to the first threshold temperature. The processor may be configured to increase the temperature of the electronic device or the surface of the charging pad when the temperature of the electronic device is less than a second threshold temperature. The second threshold temperature may be less than the first threshold temperature.

The at least one of a blower, a bypass valve or a vent may include the vent. The vent may be configured to open, partially open or close to increase or decrease the temperature of the electronic device or the surface of the charging pad.

The charging apparatus may include a second sensor. The second sensor may be configured to measure or detect an ambient temperature of a surrounding environment. The processor may be configured to control the at least one of the blower, the bypass valve or the vent to increase or decrease the temperature of the electronic device or the surface of the charging pad based on the ambient temperature and the temperature of the electronic device.

In another aspect of the subject matter may be embodied in a charging apparatus. The charging apparatus includes a first sensor. The first sensor is configured to measure or detect a temperature of the electronic device. The charging apparatus includes at least one of a blower, a bypass valve or a vent configured to adjust the temperature of the electronic device or a surface of a charging pad. The charging apparatus includes a processor coupled to the first sensor and the at least one of the blower, the bypass valve or the vent. The processor is configured to determine that the temperature of the electronic device is greater than or equal to a maximum threshold temperature. The processor is configured to control the at least one of the blower, the bypass valve or the vent to decrease the temperature of the electronic device or the surface of the charging pad when the temperature of the electronic device is greater than or equal to the maximum threshold temperature.

In another aspect, the subject matter may be embodied in a method for adjusting a temperature of a charging device within a vehicle. The method includes measuring or detecting, by a temperature sensor, a temperature of the charging device. The method includes determining, by a processor, that the temperature of the charging device is greater than a first threshold temperature. The method includes decreasing, by the processor and using at least one of a blower, a bypass valve or a vent, the temperature of the charging device when the temperature of the charging device is greater than the first threshold temperature.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, apparatuses, and methods for a charging apparatus, such as a wireless charging apparatus, in a vehicle with thermal management. The wireless charging system self-manages, controls or otherwise adjusts the temperature of the charging surface, e.g., a pad, tray or bin, to decrease, increase or otherwise manage the temperature of the user device, such as a wireless device, being charged. For example, the wireless charging system may decrease the temperature of the charging surface to decrease the temperature of wireless device being charged when the temperature of the wireless device greater than or equal to a threshold to cool the wireless device. By cooling the wireless device, the wireless charging system prevents the wireless device from overheating and more efficiently charges the wireless device.

Other benefits and advantages include the capability to increase the temperature of the charging surface to increase the temperature of the wireless device being charged when the temperature of the wireless device is less than or equal to a threshold to warm the wireless device. By warming the wireless device, the wireless device may more efficiently reach the optimal temperature and reach peak charging efficiency.

Additionally, the wireless charging system may determine the optimal temperature ranges for various wireless devices so that the wireless charging apparatus may maintain a fairly constant temperature for a variety of different types of wireless devices that may be coupled to the wireless charging system to be charged. This improves battery life of the multiple various different types of wireless devices, improves energy efficiency, and improves customer satisfaction because the wireless device does not overheat and charges as quickly as possible.

Additionally, the wireless charging system may be integrated with the heating, ventilation and air condition (HVAC) unit of the vehicle to utilize existing components to deliver, circulate or otherwise move air or liquid, such as a refrigerant, to warm or cool the surface of the charging pad or the wireless device. This allows for the use of existing components and apparatuses, which minimizes the overall cost. Moreover, by integrating with the HVAC unit, the wireless charging system may more efficiently utilize resources, such as the refrigerant, to minimize energy use and energy waste.

Figure 1:
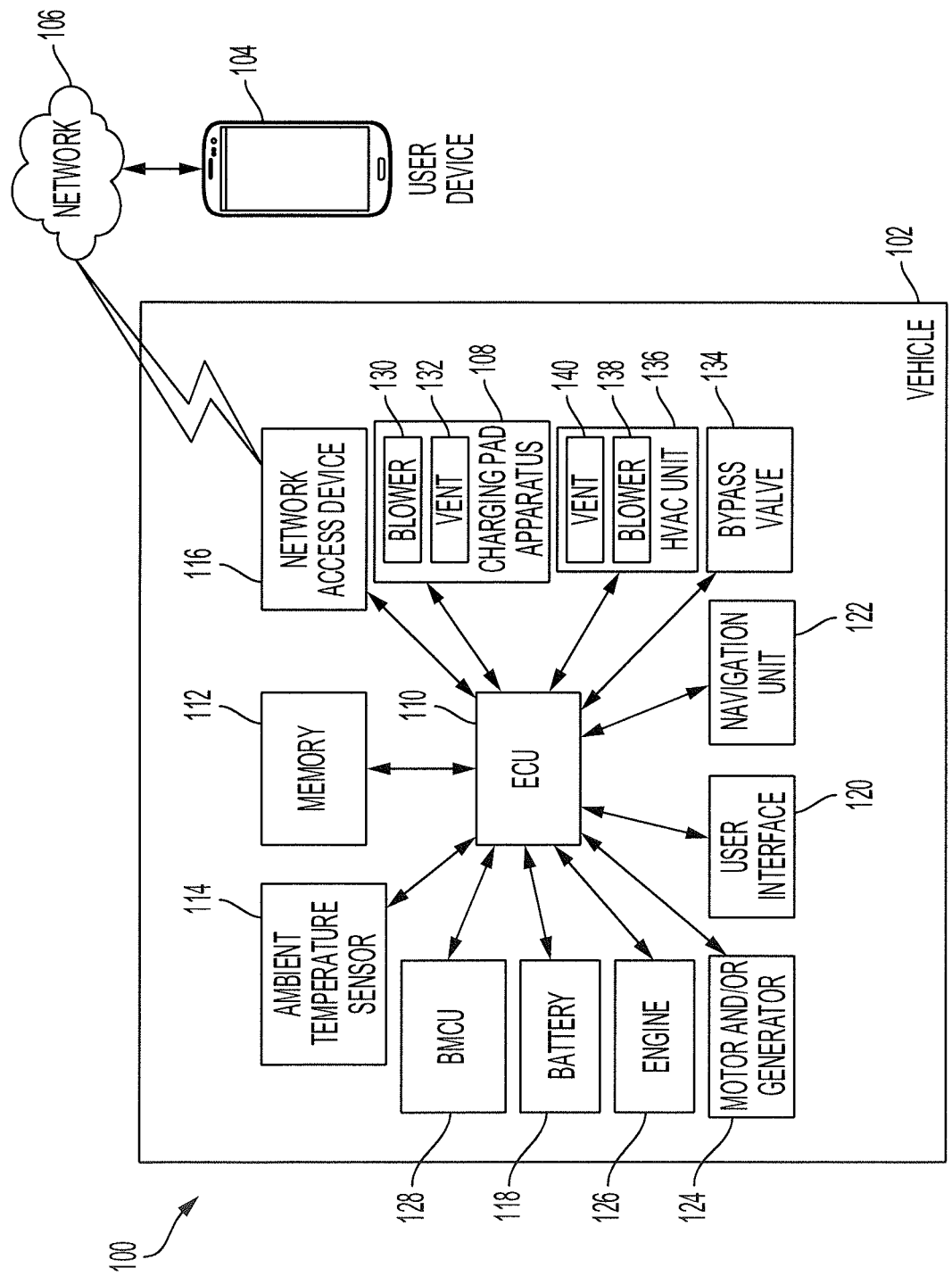
FIG. 1 is a block diagram of an example wireless charging system according to an aspect of the invention.

FIG. 1 is a block diagram of a wireless charging system 100. The wireless charging system 100 may be retro-fitted, coupled to, integrated with, include or be included within a vehicle 102 or may be entirely separate from the vehicle 102. The wireless charging system 100 may include or be coupled to a user device 104 and a charging pad apparatus 108. The user device 104 may be a personal device, a mobile device, such as a smartphone, audio/visual player or other electronic or wireless device that may be charged using the wireless charging system 100 via the charging pad apparatus 108. The user device 104 may be charged via a wireless or a wired connection.

The wireless charging system 100 may have or use a network 106 to communicate among different components of the wireless charging system 100, such as between the charging pad apparatus 108, the vehicle 102 and/or the user device 104. The network 106 may be a Dedicated Short-Range Communication (DSRC) network, a local area network (LAN), a wide area network (WAN), a cellular network, the Internet, or combination thereof, that connects, couples and/or otherwise communicates among the different components of the wireless charging system 100.

The wireless charging system 100 detects or measures various parameters of the user device 104, the environment of the vehicle 102 and/or the status of the charging pad apparatus 108 and manages the temperature of the user device 104 to operate the user device 104 within the optimal temperature range to obtain peak or maximum energy efficiency. When the user device 104 is either too cold or too hot, the user device 104 does not operate at peak energy efficiency, which increases the charging time and may cause discomfort and/or dissatisfaction to the user of the user device 104. The various parameters may include an ambient temperature of the surrounding environment, the temperature of the charging pad apparatus 108, the temperature of the user device 104, the resource load on the user device 104, and/or the state of charge of the battery of the user device 104. Each of these various parameters effect the temperature of the user device 104 when the user device 104 is charging.

In some implementations, the functions of detecting, measuring and managing the temperature of the user device 104 to maintain the user device 104 within the optimal temperature range may be implemented in a charging system using a wired connection to charge the user device 104. The user device 104 may not necessarily be positioned within a charging pad apparatus 108 but rather be directly connected to a power source, such as via a cable, and placed on a device pad that warms or cools the user device 104.

Figure 3:
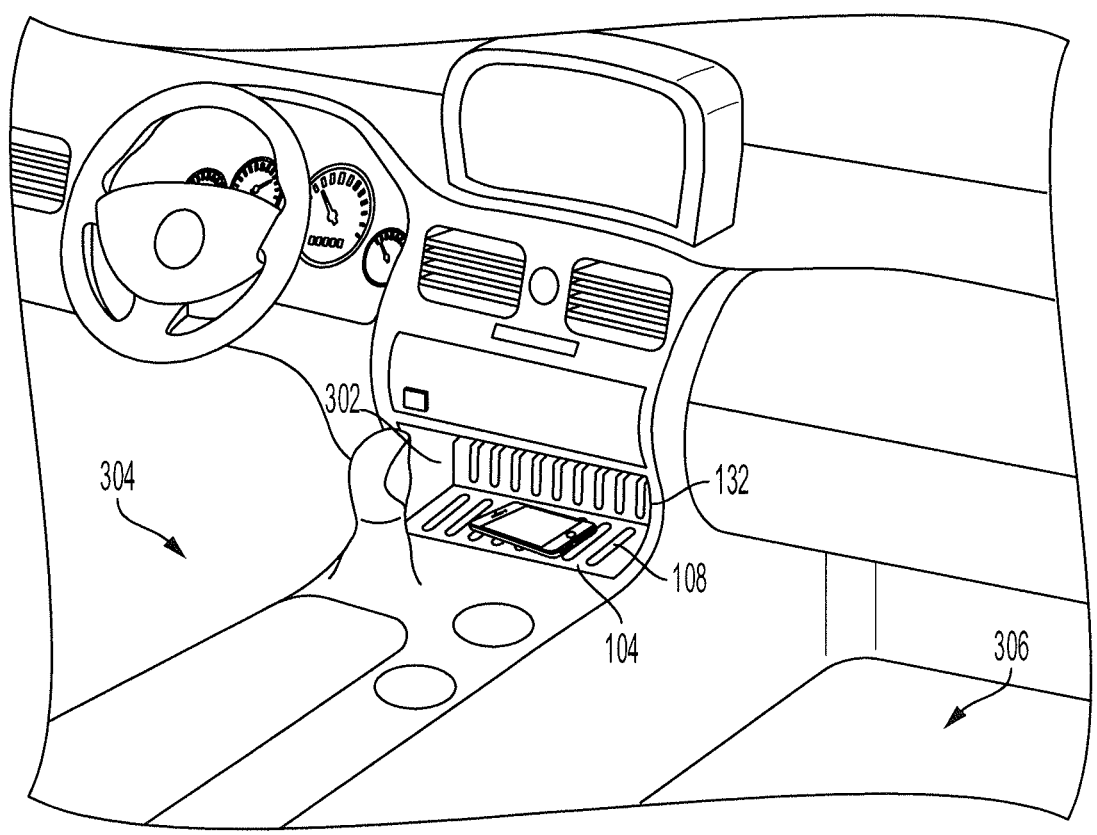
FIG. 3 shows an example charging apparatus pad with vents integrated within the dashboard of the vehicle according to an aspect of the invention.

The wireless charging system 100 may include or be retro-fitted or integrated with the vehicle 102. The charging pad apparatus 108 of the wireless charging system 100 may be positioned with an interior compartment of the vehicle 102, such as within a portion 302 of the dashboard equidistant in between the driver seat 304 and the passenger seat 306 to provide for easy access by the occupants of the vehicle 102 to charge a user device 104, as shown in FIG. 3 for example. The wireless charging system 100 may have or use components of the vehicle 102, such as the electronic control unit 110, the memory 112, the network access device 116 and/or the ambient temperature sensor 114. The wireless charging system 100 may draw power from a power source, such as the battery 118 of the vehicle 102 and/or may have its own separate power source (not shown).

A vehicle 102 is a conveyance capable of transporting a person, an object, or a permanently or temporarily affixed apparatus. The vehicle 102 may be a self-propelled wheeled conveyance, such as a car, sports utility vehicle, truck, bus, van or other motor, battery or fuel cell driven vehicle. For example, the vehicle 102 may be an electric vehicle, a hybrid vehicle, a hydrogen fuel cell vehicle, a plug-in hybrid vehicle or any other type of vehicle that has a fuel cell stack, a motor and/or a generator. Other examples of vehicles include bicycles, trains, planes, or boats, and any other form of conveyance that is capable of transportation. The vehicle 102 may be semi-autonomous or autonomous. That is, the vehicle 102 may be self-maneuvering and navigate without human input. An autonomous vehicle may have and use one or more sensors and/or a navigation unit to drive autonomously.

Figure 2A:
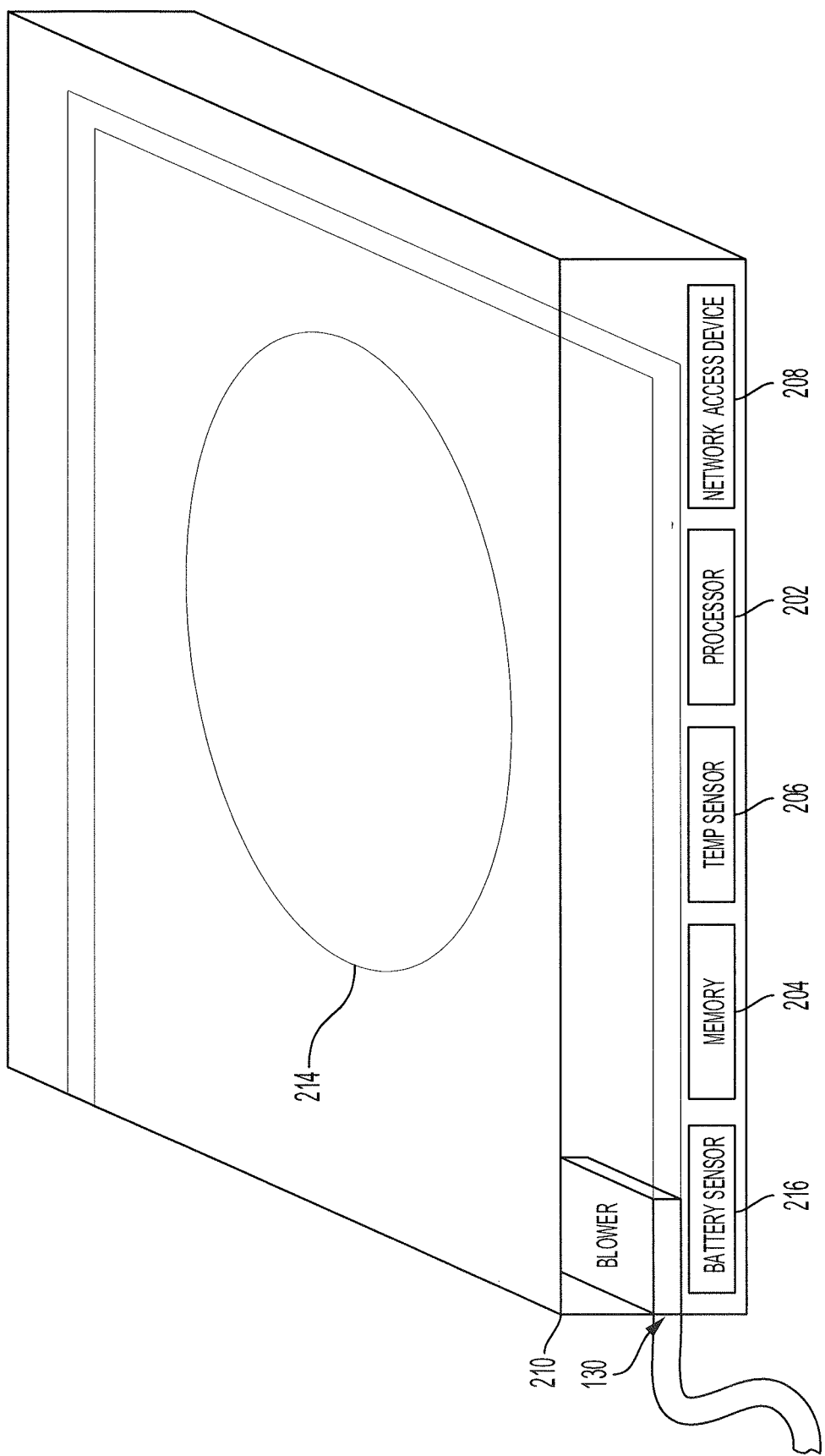
FIG. 2A shows an example charging apparatus pad of the wireless charging system of FIG. 1 according to an aspect of the invention.

In some implementations, the wireless charging system 100 may have separate components enclosed within a charging pad apparatus 108, such as the processor 202, the memory 204, the battery sensor 216, the temperature sensor 206 and/or the network access device 208, as shown in FIG. 2A for example. The charging pad apparatus 108 may be mounted to the vehicle 102 and may communicate with the user device 104 to obtain various parameters and control the temperature of the user device 104. The charging pad apparatus 108 may have a wireless transmitter 214 that provides the wireless charge to the user device 104 when the user device 104 is placed on the charging pad apparatus 108. The charging pad apparatus 108 may have a wireless charging pad or housing 210 that encloses and surrounds components of the charging pad apparatus 108, such as the wireless transmitter 214, the memory 204, the temperature sensor 206, the battery sensor 216, the processor 202 and/or the network access device 208. The wireless transmitter 214 may be positioned within a surface of the housing in close proximity to the user device 104 that is being charged.

Figure 2B:
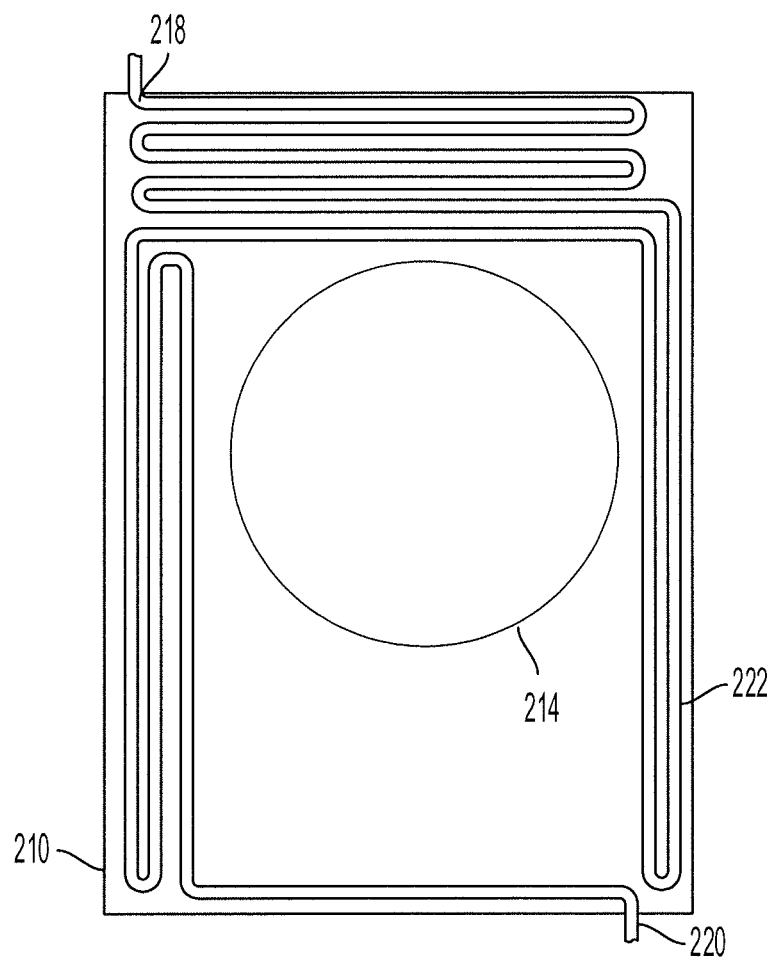
FIG. 2B shows a cross-sectional view of the charging apparatus pad of the wireless charging system of FIG. 1 according to an aspect of the invention.

The housing 210 may also enclose and surround at least one of a blower 130, a vent 132 and/or one or more pipes or coils (hereinafter, referred to as "one or more pipes") 222. The one or more pipes 222 may snake in and around the wireless transmitter 214, as shown in FIG. 2B for example. The one or more pipes 222 allow an air, liquid, such as a refrigerant, or other gases or liquid (hereinafter, referred to as "medium") to pass through the one or more pipes and provide temperature regulation of the surface of the charging pad apparatus 108 to cool or warm the user device 104 when the user device 104 is placed on the surface of the charging pad apparatus 108. For example, the one or more pipes 222 may be coupled to the blower 130 or the vent 132 to allow the medium to circulate within the enclosure. In some implementations, the one or more pipes 222 are coupled to the bypass valve 134 to allow the medium to be redirected from the HVAC unit 136 and into the charging pad apparatus 108. The medium may enter at an entrance pipe 218 that fluidly connects with the pipes of the HVAC unit 136 or may be coupled to an independent blower 130 or vent 132 of the charging pad apparatus 108. The one or more pipes 222 surround and/or are around the periphery or perimeter of the wireless transmitter 214 and may exit through the pipe 220 back into the HVAC unit 136 or through another exit, such as evaporated and vented through a vent. The one or more pipes 222 may be non-metallic but also thermally conductive to transfer heat but not current, such as made from a ceramic material. In some implementations, the medium may be engine coolant, which may be redirected through the one or more pipes 222 to absorb heat from the surface of the charging pad apparatus 108 and transfer the heat to a radiator of the vehicle 102.

The wireless charging system 100 includes or couples to one or more processors, such as the electronic control unit 110 or the processor 202, a memory 112, 204, one or more sensors, such as the ambient temperature sensor 114, the battery sensor 216 or the temperature sensor 206 and/or a network access device 116, 208 within the vehicle 102 and/or the charging pad apparatus 108. The wireless charging system 100 may include or couple to a user interface 120 and/or other vehicle components of the vehicle 102, such as a navigation unit 122, a motor and/or generator 124, an engine 126, a battery 118, a battery management control unit 128, and an HVAC unit 136. The wireless charging system 100 may not necessarily include the other vehicle components, but rather, may be coupled to the other vehicle components.

The ECU 110 and/or the processor 202 may be implemented as a single processor or as multiple processors. For example, the processor 202 may be a microprocessor, data processor, microcontroller or other controller, and may be electrically coupled to some or all the other components within the vehicle 102 and/or the charging pad apparatus 108. The ECU 110 and/or the processor 202 may control the HVAC unit 136, such as the speed of the blower 138 and/or the opening or closing of the vent of the HVAC unit 136. The ECU 110 and/or the processor 202 may also control the speed of the blower 130 and/or the vent 132 of the charging pad apparatus 108 or a bypass valve 134 to increase or decrease flow of the air, liquid or other gases or liquid to cool or warm the surface of the housing 210 of the charging pad apparatus 108 and/or the user device 104. The ECU 110 may be coupled to the memory 112, and the processor 202 may be coupled to the memory 204.

The wireless charging system 100 has a memory 112, 204. The memory 112, 204 may be coupled to the ECU 110 or the processor 202, respectively, and store instructions that the ECU 110 or the processor 202 executes. The memory 112, 204 may include one or more of a Random Access Memory (RAM), Read Only Memory (ROM) or other volatile or non-volatile memory. The memory 112, 204 may be a non-transitory memory or a data storage device, such as a hard disk drive, a solid-state disk drive, a hybrid disk drive, or other appropriate data storage, and may further store machine-readable instructions, which may be loaded and executed by the ECU 110 or the processor 202, respectively. The memory 112, 204 may store one or more device settings, such as a minimum temperature threshold, a maximum temperature threshold and/or an optimal temperature range, for various types of user devices.

The wireless charging system 100 may include one or more sensors. The one or more sensors may include an ambient temperature sensor 114, a battery sensor 216 or a temperature sensor 206. The ambient temperature sensor 114 may detect or measure an ambient temperature of the environment within the passenger compartment of the vehicle 102. The ambient temperature sensor 114 may be positioned within the vehicle 102 or may be mounted, included within or coupled to the charging pad apparatus 108. The battery sensor 216 may detect or measure a state of charge of the battery of the user device 104. The temperature sensor 206, such as a laser, an infrared sensor or other temperature sensor, may detect or measure a temperature of the user device 104 and/or a temperature of the surface of the housing 210 of the charging pad apparatus 108. Similarly, the battery sensor 216 and/or the temperature sensor 206 may be mounted to, included within or otherwise coupled to the charging pad apparatus 108 and/or may be positioned within the vehicle 102. In some implementations, the one or more sensors may be on the user device 104, which may communicate the sensor data, such as the temperature of the ambient environment or user device 104 and/or the state of charge of the user device 104 to the charging pad apparatus 108.

The wireless charging system 100 includes one or more temperature regulation devices. The one or more temperature regulation devices may include one or more blowers 130, 138, one or more vents 132, 140 and/or a bypass valve 134. The one or more blowers 130, 138 may include a blower 130 that is within the charging pad apparatus 108 and independent of the vehicle 102 and/or a blower 138 that is part of the HVAC unit 136 of the vehicle 102. Similarly, the vent 132 may be within the charging pad apparatus 108, or the vent 140 may be part of the HVAC unit 136 of the vehicle 102.

The one or more temperature regulation device may be coupled to an independent power source or be coupled to a power source coupled to the vehicle 102, such as the electrical system or battery 118 of the vehicle 102. The ECU 110 and/or the processor 202 may control, position, activate or otherwise adjust the one or more temperature regulation devices to adjust the temperature of the user device 104 and/or the surface of the housing 210. The one or more temperature regulation devices may be controlled to increase or decrease the temperature of the user device 104 and/or the surface of the charging pad apparatus 108. For example, the speed of the one or more blowers 130, 138 may be activated and/or adjusted to control the increase or decrease of flow of the medium within the one or more pipes 222 to adjust the temperature of the user device 104 and/or the surface of the charging pad apparatus 108. The medium may be water, refrigerant or other liquid that absorbs the heat from the user device 104 and/or the surface of the charging pad apparatus 108 and evaporates, which causes the user device 104 and/or the surface of the charging pad apparatus 108 to evaporatively cool. In another example, the one or more vents 132, 140 and/or the bypass valve 134 may be opened or closed to control the increase or decrease of the flow of the medium within the one or more pipes 222.

The wireless charging system 100 may have a user interface 120 and/or a network access device 116, 208. The user interface 120 may receive user input that indicates a device profile, which indicates the type of user device 104 that is being charged. In some implementations, the wireless charging system 100 may automatically detect the type of user device 104 that is being charged when the user device 104 is connected to the charging pad apparatus 108. For example, the user interface 120 may receive user input, such as a user selection, which identifies the device type.

The user interface 120 may include an input/output device that receives user input from a user interface element, a button, a dial, a microphone, a keyboard, or a touch screen. The user interface 120 may provide an output to an output device, such as a display, a speaker, an audio and/or visual indicator, or a refreshable braille display. The output device may display an alert or notification that the charging pad apparatus 108 is charging the user device 104, the state of charge or temperature of the user device 104 and/or other relevant information related to the charging of the user device 104.

The network access devices 116, 208 may include a communication port or channel, such as one or more of a Dedicated Short-Range Communication (DSRC) unit, a Wi-Fi unit, a Bluetooth® unit, a radio frequency identification (RFID) tag or reader, or a cellular network unit for accessing a cellular network (such as 3G, 4G or 5G). The network access devices 116, 208 may transmit data to and receive data from the different components of the different entities of the wireless charging system 100, such as the user device 104, the charging pad apparatus 198 and/or the vehicle 102.

The one or more vehicle components may include a navigation unit 122. The navigation unit 122 may be integral to the vehicle 102 or a separate unit coupled to the vehicle 102. The vehicle 102 may include a Global Positioning System (GPS) unit (not shown) for detecting location data including a current location of the vehicle 102 and date/time information instead of the navigation unit 122. In that regard, the ECU 110 may perform the functions of the navigation unit 122 based on data received from the GPS unit. The navigation unit 122 or the ECU 110 may perform navigation functions. Navigation functions may include, for example, route and route set prediction, providing navigation instructions, and receiving user input such as verification of predicted routes and route sets or destinations.

The one or more vehicle components may include a motor and/or generator 124. The motor and/or generator 124 may convert electrical energy into mechanical power, such as torque, and may convert mechanical power into electrical energy. The motor and/or generator 124 may be coupled to the battery 118. The motor and/or generator 124 may convert the energy from the battery 118 into mechanical power, and may provide energy back to the battery 118, for example, via regenerative braking. The vehicle 102 may include one or more additional power generation devices such as the engine 126 or a fuel cell stack (not shown). The engine 126 combusts fuel to provide power instead of and/or in addition to the power supplied by the motor and/or generator 124.

The battery 118 may be coupled to the motor and/or generator 124 and may provide electrical energy to and receive electrical energy from the motor and/or generator 124. The battery 118 may include one or more rechargeable batteries and provide power to the charging pad apparatus 108.

The BMCU 128 may be coupled to the battery 118 and may control and manage the charging and discharging of the battery 118. The BMCU 128, for example, may measure, using battery sensors, parameters used to determine the state of charge (SOC) of the battery 118. The BMCU 128 may control the battery 118.

Figure 4:
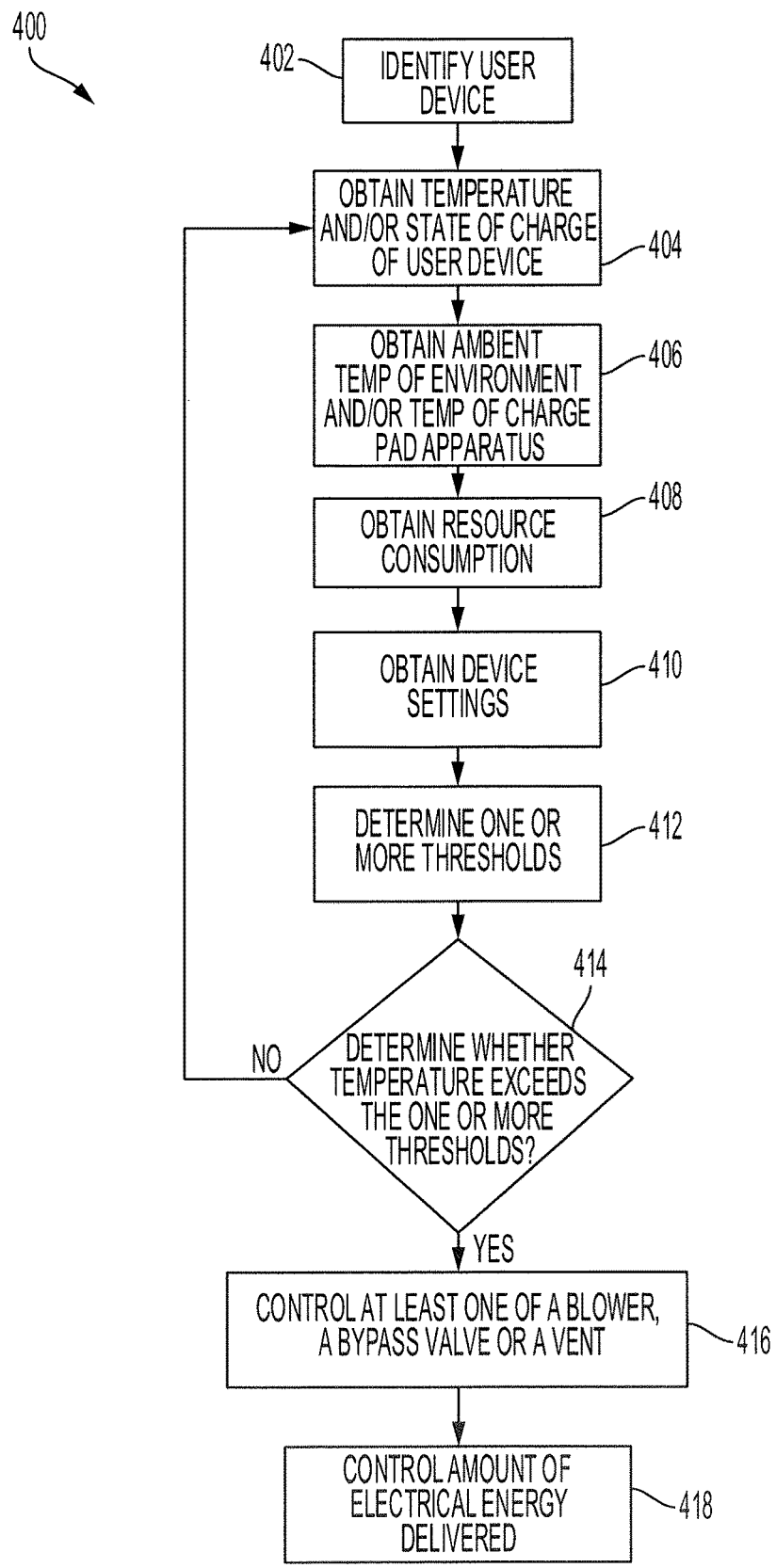
FIG. 4 is a flow diagram of an example process for activating the wireless charging system of FIG. 1 according to an aspect of the invention.

FIG. 4 is a flow diagram of a process 400 for activating the one or more temperature regulation devices to control the temperature of the user device 104 that is being charged. One or more computers or one or more data processing apparatuses, for example, the ECU 110 and/or the processor 202 of the wireless charging system 100 of FIG. 1, appropriately programmed, may implement the process 400.

The wireless charging system 100 may identify the user device 104 (402). The wireless charging system 100 may receive user input from the user interface 120 to identify the type of user device 104 to be charged. For example, the user interface 120 may receive a user selection from a touchscreen display that identifies the type of user device 104 being connected or coupled for charging. In some implementations, the user device 104 may be paired with the charging pad apparatus 108 and based on the communication or power transfer protocol, the wireless charging system 100 may determine the type of user device 104 that is connected to be charged. Thus, the wireless charging system 100 may tailor the warming or cooling of the user device 104 to specific device requirements of the user device 104 to maximize wireless charging efficiency by maintaining the user device 104 within the optimal temperature range.

The wireless charging system 100 may obtain the temperature and/or state of charge of the user device 104 (404). The wireless charging system 100 may use the temperature sensor 206 and/or the battery sensor 216 to measure the temperature and/or the state of charge, respectively, of the user device 104. Once measured, the temperature and/or the state of charge may be provided to the processor 202 and/or the ECU 110 to be used to determine whether to activate the one or more temperature regulation devices. In some implementations, the user device 104 communicates with and the ECU 110 and/or the processor 202 receives the temperature and/or the state of charge of the user device 104 from the user device 104 via the network access device 116, 208.

The wireless charging system 100 may obtain the ambient temperature of the environment and/or the temperature of the charging pad apparatus 108 (406). The wireless charging system 100 may obtain the ambient temperature of the environment within the passenger compartment of the vehicle 102 and in proximity to the charging pad apparatus 108 using the ambient temperature sensor 114. The ambient temperature and/or the temperature of the charging pad apparatus 108 may affect the rate of cooling, rate of warming and/or temperature of the user device 104. And so, the wireless charging system 100 may use the measured temperatures as factors when adjusting or controlling the one or more temperature regulation devices to increase or decrease the temperature of the user device 104.

The wireless charging system 100 may obtain the amount of resource consumption or processing power that is being used by the user device 104 (408). The charging pad apparatus 108 may receive from the user device 104 statistics that indicate the resource consumption of the user device 104. The wireless charging system 100 may factor in the amount of resource consumption or processing power that is being used when adjusting the temperature of the user device 104 because resource consumption and processing contributes to electrical energy use and an increase in temperature of the user device 104.

The wireless charging system 100 may obtain one or more device settings (410). The one or more device settings set the optimal temperature range of the particular user device 104 that is being charged, e.g., the one or more thresholds that define the optimal temperature range. The optimal temperature range is the temperature range where the user device 104 operates most efficiently and defines a minimum temperature and a maximum temperature.

The wireless charging system 100 may obtain the one or more device settings from the memory 112, 204 based on the type of device. The wireless charging system 100 may store multiple device settings in the memory 112, 204 and associate the type of user device identified with one or more corresponding device settings. Since each user device 104 may have a different optimal temperature range, the wireless charging system 100 is able to adjust and cool or warm the user device 104 for optimal charging and device management, i.e., keeping the user device 104 at an optimal temperature.

Once the one or device settings are obtained, the wireless charging system 100 determines the one or more thresholds for the user device 104 based on the one or more device settings (412). The wireless charging system 100 uses the one or more device settings to define the one or more thresholds, such as a minimum temperature threshold and a maximum temperature threshold, which the user device 104 operates within to adjust the temperature of the user device 104 accordingly. Since the device settings are different for various user devices, the one or more thresholds may be different for different types of user devices 104. For example, the one or more device settings may indicate an optimal temperature range having a minimum temperature threshold of approximately 55 degrees Fahrenheit (F) and a maximum temperature threshold of approximately 75 degrees F.

The wireless charging system 100 determines whether the temperature of the user device 104 exceeds the one or more thresholds (414). When the temperature of the user device 104 exceeds the one or more thresholds, the energy transfer to the user device 104 is suboptimal. For example, when the user device 104 is too hot, electrical energy is lost in the transfer due to heat and the components of the user device 104 and/or charging pad apparatus 108 may overheat or become damaged. Moreover, the user device 104 may be too hot to touch, which may cause user discomfort and/or dissatisfaction. In another example, when the temperature of the user device 104 is too cold, electrical energy may be used to warm the user device 104 instead of to charge the user device 104, and so, charging of the user device 104 may take longer.

If the temperature of the user device 104 does not exceed the one or more thresholds, the wireless charging system 100 continues to monitor the temperature of the user device 104 (404). If the temperature of the user device 104 does exceed the one or more thresholds, the wireless charging system 100 activates and controls the one or more temperature regulation devices to control, adjust or otherwise maintain the temperature of the user device 104 within the optimal temperature range (416). In some implementations, the activation or control of the one or more temperature regulation devices may be based on user input, such as user input that activates the air conditioner or heater of the HVAC unit 136.

The wireless charging system 100 may control the amount of medium that flows through the one or more pipes 222, e.g., by controlling the speed of one or more blowers 130, 138, the position of the one or more vents 132, 140 and/or the position of the bypass valve 134, to regulate the amount and circulation of the medium. For example, the one or more vents 132, 140 and/or the bypass valve 134 may be opened, partially opened and/or closed to regulate the amount of medium that circulates around the user device 104 and/or flows through the one or more pipes 222.

The medium may be a liquid, such as water or refrigerant, which absorbs the heat from the surface of the charging pad apparatus 108 and/or the user device 104 and evaporates to cool the surface of the charging pad apparatus 108 and/or the user device 104. The evaporated liquid or gas may flow and exit through the pipe 220 back into the HVAC unit 136 or may otherwise exit the charging pad apparatus 108, such as through the vent 132.

The wireless charging system 100 may control the rate of flow of the medium to increase or decrease the amount and rate of temperature increase or decrease of the surface of the charging pad apparatus 108, and subsequently, the user device 104. By increasing the rate of flow of the medium, which absorbs the heat, the amount and rate of temperature decrease may increase, whereas, decreasing the rate of flow of the same medium, may decrease the amount and rate of temperature decrease. In some implementations, the medium may be warm air, which may be circulated through the one or more pipes 222 to increase the amount and rate of temperature increase of the surface of the charging pad apparatus 108 and/or the user device 104.

When the heat from the user device 104 is transferred to the underside of the charging pad apparatus 108 and the medium draws the heat away from the user device 104. The user device 104 may be charged at higher power levels without overheating or creating a thermal shut down. Conversely, if the surface of the charging pad apparatus 108 needs to be warmed for optimal charging, the one or more temperature regulation devices would prevent or reduce the amount of medium that is diverted, blown or otherwise moved.

The control of the one or more temperature regulation devices may affect the rate and the amount of the medium that is delivered or circulated and may be based on various factors. The various factors include the temperature of the user device 104, the ambient temperature, the amount of resource consumption occurring in the user device 104, the temperature of the user device 104 and/or the charging pad apparatus 108, and/or the state of charge of the user device 104. Each factor affects the amount of heat absorbed, which affects the existing heat and rate of change of the temperature of the user device 104. The control and activation of the one or more temperature regulation devices may continue until the temperature of the user device 104 is within the optimal temperature range so that the wireless charging system 100 may continue to provide the most efficient electrical charge to the user device 104.

For example, when the ambient temperature surrounding the user device 104 is cooler or colder, there may be naturally occurring cooling that facilitates the decrease in temperature of the user device 104. And so, the rate and amount of decrease may be facilitated accordingly to achieve a fairly constant temperature.

Figure 5:
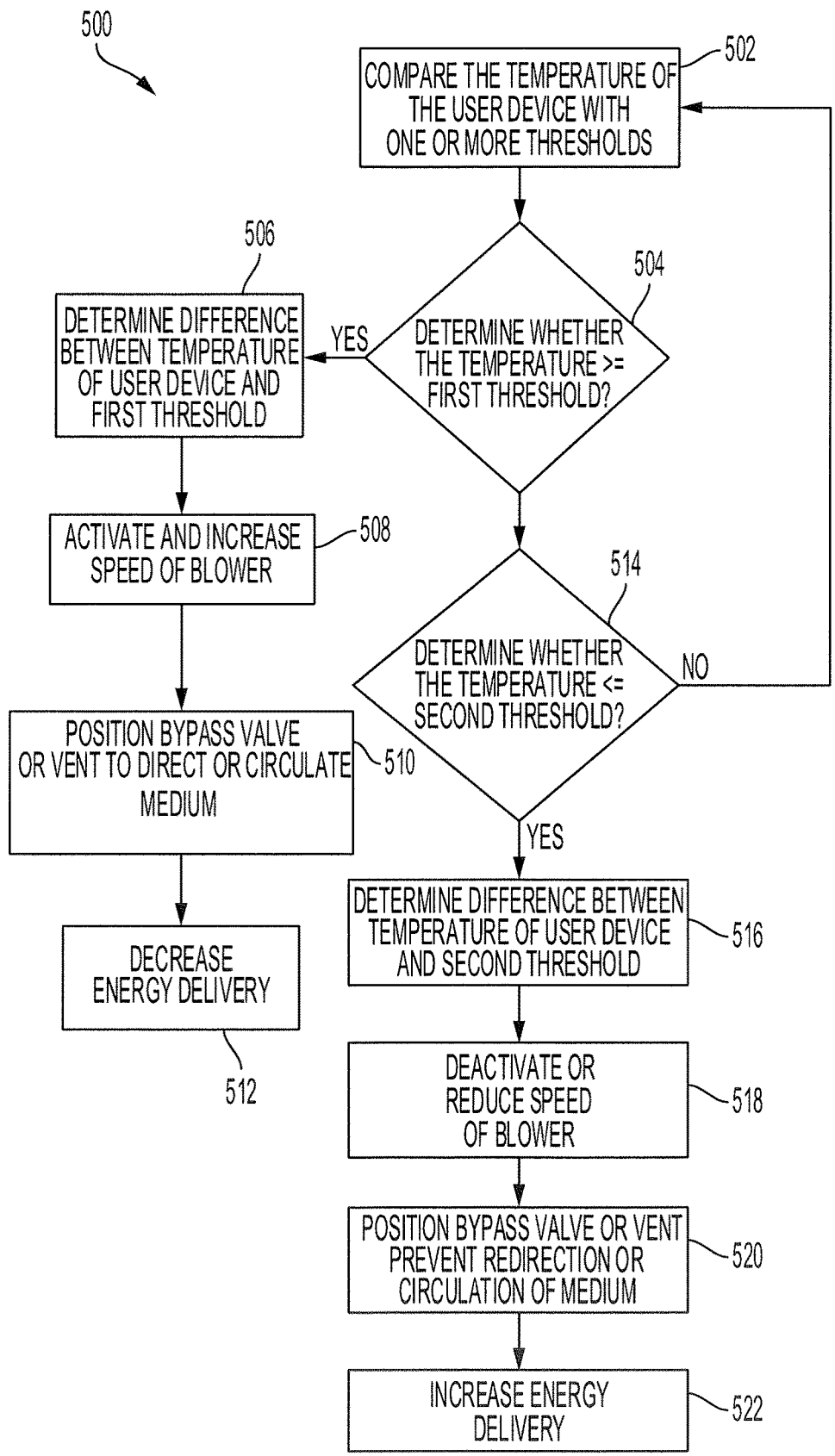
FIG. 5 is a flow diagram of an example process for controlling the one or more temperature regulation devices of the wireless charging system of FIG. 1 according to an aspect of the invention.

In another example, as the resource consumption increases, the user device 104 generates heat that increases the temperature of the user device 104. In another example, when the battery of the user device 104 is nearly full, the wireless charging system 100 may not activate the one or more temperature regulation devices, but instead, the wireless charging system 100 may shutoff charging of the user device 104 when the user device 104 is hot because the user device 104 does not need to be charged. And thus, the wireless charging system 100 may operate differently based on a combination of factors. FIG. 5 further describes the various thresholds and adjustments that the wireless charging system 100 employs to maintain the user device 104 at a fairly constant and optimal temperature of wireless charging.

In some implementations, the wireless charging system 100 may also adjust or control the amount of electrical energy delivered to the user device 104 for charging based on the temperature of the user device 104 (418). The wireless charging system 100 may operate the wireless transmitter 214 to deliver a varying amount of electrical energy. When the temperature of the user device 104 is above a high threshold temperature, the wireless charging system 100 may lower the amount of power delivered to the user device 104 or shutoff the power to the user device 104 to reduce the temperature of the user device 104. This may prevent the user device 104 from overheating. Similarly, when the temperature of the user device 104 is below a low threshold temperature, the wireless charging system 100 may increase the amount of power delivered to the user device 104 to increase the temperature of the user device 104. Ideally, the wireless charging system 100 delivers the electrical energy at peak efficiency but controlling the amount of power delivered adds an additional layer protection for the user device 104.

FIG. 5 is a flow diagram of a process 500 for controlling the one or more temperature regulation devices to increase or decrease the temperature of the user device 104 that is being charged. One or more computers or one or more data processing apparatuses, for example, the ECU 110 and/or the processor 202 of the wireless charging system 100 of FIG. 1, appropriately programmed, may implement the process 500.

The wireless charging system 100 may compare the temperature of the user device 104 with one or more thresholds defined by the one or more device settings (502). The wireless charging system 100 compares the temperature of the user device 104 with the one or more thresholds to determine whether the user device 104 is within an optimal temperature range as defined by the one or more device settings, such as within a minimum temperature threshold and a maximum temperature threshold. This is to maintain the user device 104 at a fairly constant temperature to operate at peak efficiency.

The wireless charging system 100 determines whether the temperature of the user device 104 is greater than or equal to a first threshold (504). The determination may be based on the comparison of the temperature of the user device 104 and the first threshold. The first threshold is based on the one or more device settings and may be a maximum temperature threshold of the optimal temperature range for the user device 104. If the temperature of the user device 104 is less than the first threshold, the wireless charging system 100 determines whether the temperature of the user device 104 is less than or equal to a second threshold (514). If the temperature of the user device 104 is greater than or equal to the first threshold, the wireless charging system 100 may determine a difference between the temperature of the user device 104 and the first threshold (506). The wireless charging system 100 may calculate the difference and use the difference to determine an amount to decrease the temperature of the user device 104.

The wireless charging system 100 may activate and/or increase the speed of the one or more blowers 130, 138 to decrease the temperature of the user device 104 and/or a surface of the charging pad apparatus 108 (508). When the charging pad apparatus 108 is coupled to the HVAC unit 136, such as when the one or more pipes 222 are in fluid communication with the pipes of the HVAC unit 136, the wireless charging system 100 may control the activation, deactivation and speed of the blower 138 of the HVAC unit 136. Whereas, when the charging pad apparatus 108 has its own independent blower 130, the wireless charging system 100 controls the activation, deactivation and speed of the blower 130.

The wireless charging system 100 may first activate the one or more blowers 130, 138 and depending on the difference between the temperature of the user device 104 and the first threshold, adjust the speed of the one or more blowers 130, 138. The difference may be mapped to a corresponding speed of the one or more blowers 130, 138 and the wireless charging system 100 may adjust a current speed of the one or more blowers 130, 138 to the corresponding speed. The corresponding speed may be an increased speed to decrease the temperature of the user device 104 and/or the surface of the charging pad apparatus 108.

The wireless charging system 100 may position a bypass valve 134 and/or one or more vents 132, 140 to redirect or circulate the medium (510). For example, the wireless charging system 100 may open or further open one or more vents 132, 140 to circulate a medium, such as air, within the one or more pipes 222 and/or circulate air surrounding the charging pad apparatus 108 to cool and/or reduce the temperature of the user device 104 and/or the surface of the charging pad apparatus 108. In another example, the wireless charging system 100 may open or further open the bypass valve 134 to redirect the flow of a medium, such as refrigerant from the HVAC unit 136 into the one or more pipes 222. As the medium is circulated around or within the charging pad apparatus and/or the medium is redirected and flows into the one or more pipes 222 within the charging pad apparatus, the medium absorbs the heat of the user device 104 and/or the surface of the charging pad apparatus 108 to decrease the temperature of the user device 104 and/or the surface of the charging pad apparatus 108. The medium may further evaporate and cool the user device 104 and/or the surface of the charging pad apparatus 108.

The amount of increase of the speed of the one or more blowers 130, 138 and/or the amount that the bypass valve 134 and/or the one or more vents 132, 140 are opened may be based on the difference in temperature between the temperature of the user device 104 and the first threshold. The wireless charging system 100 may continue to operate the one or more temperature regulation devices to decrease the temperature of the user device 104 until the temperature of the user device 104 is below the first threshold and within the optimal temperature range.

The control of the one or more temperature regulation devices to decrease the temperature of the user device 104 may also be based on the state of charge of the battery, the ambient temperature and/or the resource consumption of the user device 104. The amount to decrease the temperature of the user device 104 may be directly proportional or correlated with the ambient temperature, the resource consumption and/or the state of charge of the battery. Since a higher ambient temperature, resource consumption and/or state of charge of the battery results in a greater or increased temperature for the user device 104 than normal, the user device 104 must be cooled to a greater degree so that the temperature of the user device 104 is within the optimal temperature range. Thus, the amount necessary to decrease the temperature of the user device 104 to the optimal temperature range and below the first threshold will be greater.

When the difference between the temperature and the first threshold exceeds a safety margin, such as when the user device 104 is very hot, e.g., greater than approximately 80° F., the wireless charging system 100 may reduce the amount of electrical energy delivered to the user device 104 (512). The wireless charging system 100 may reduce the amount of electrical energy transmitted through the wireless transmitter 214 to charge the user device 104 when the difference in temperature exceeds the safety margin. For example, the wireless charging system 100 may decrease the power output from 15 W to 10 W or 5 W. In another example, the wireless charging system 100 may shutoff the power output. This prevents the user device 104 from overheating and/or damaging the components of the user device 104.

When the wireless charging system 100 determines that the temperature of the user device 104 is less than the first threshold, the wireless charging system 100 may determine whether the temperature is less than or equal to a second threshold, such as the minimum temperature threshold (514). The determination may be based on the comparison between the temperature of the user device 104 and the second threshold. The second threshold may be based on the one or more device settings and may be a minimum temperature threshold of the optimal temperature range for the user device 104.

If the temperature of the user device 104 is greater than the second threshold, the wireless charging system 100 is within the optimal temperature range and may continue to compare the temperature of the user device 104 and the one or more thresholds. If the temperature of the user device 104 is less than or equal to the second threshold, the wireless charging system 100 may determine a difference between the temperature of the user device 104 and the second threshold (516). The wireless charging system 100 may calculate the difference and use the difference to determine an amount to increase the temperature of the user device 104 or an amount to allow the temperature of the user device 104 to increase.

The wireless charging system 100 may deactivate and/or decrease the speed of the one or more blowers 130, 138 so that the temperature of the user device 104 and/or a surface of the charging pad apparatus 108 may increase (518). With the one or more blowers 130, 138 deactivated and/or the speed reduced, the user device 104 and/or surface of the charging pad apparatus 108 may gradually warm due to the naturally occurring warmth generated from the charging of the user device 104 on the surface of the charging pad apparatus 108. The reduced or lack of air circulation caused by the reduced speed or deactivation of the one or more blowers 130, 138 may limit the amount of heat that is carried or circulated away.

The deactivation and/or decrease in the speed of the one or more blowers may be based on the difference between the temperature of the user device 104 and the second threshold. The difference may be mapped to a corresponding speed of the one or more blowers 130, 138 and the wireless charging system 100 may adjust a current speed of the one or more blowers 130, 138 to the corresponding speed. The corresponding speed may be a decreased speed to reduce any cooling, which allows the natural warming of the user device 104 due to the charging of the user device 104.

The wireless charging system 100 may position the bypass valve 134 and/or one or more vents 132, 140 to prevent redirection or circulation of the medium (520). For example, the wireless charging system 100 may close or further close one or more vents 132, 140 to reduce or eliminate circulation of the medium, such as air, within the one or more pipes 222 and/or circulation of air surrounding the charging pad apparatus 108. This allows the user device 104 and/or surface of the charging pad apparatus 108 to naturally warm or increase in temperature due to the charging of the user device 104. In another example, the wireless charging system 100 may close or further close the bypass valve 134 to reduce or eliminate the redirection of the flow of the medium, such as refrigerant from the HVAC unit 136 into the one or more pipes 222. As less medium is circulated around or within the charging pad apparatus 108 and/or less medium is redirected or flows into the one or more pipes 222 within the charging pad apparatus 108, the medium absorbs less heat of the user device 104 and/or the surface of the charging pad apparatus 108. This further allows the temperature of the user device 104 to increase due to the natural warmth of the charging of the user device 104.

The amount that the wireless charging system 100 increases the temperature of the user device 104 may be based on the difference in temperature between the temperature of the user device 104 and the second threshold. The wireless charging system 100 may allow the temperature of the user device 104 to increase unimpeded until the temperature of the user device 104 is above the second threshold and within the optimal temperature range.

The amount of temperature increase of the user device 104 may be based on the state of charge of the battery, the ambient temperature and/or the resource consumption of the user device 104. The amount may be indirectly proportional or correlated with the ambient temperature, the resource consumption and/or the state of charge of the battery. Since a lower ambient temperature, resource consumption and/or state of charge of the battery results in a lesser or decreased temperature for the user device 104 than normal, the user device 104 may be allowed to warm to a greater degree so that the temperature of the user device 104 is within the optimal temperature range. Thus, the amount necessary to increase the temperature of the user device 104 to the optimal temperature range and above the second threshold will be greater than when these factors are higher or in greater demand.

When the difference between the temperature and the second threshold exceeds an operating margin, such as when the user device 104 is very cool, e.g., at approximately 50 degrees F., the wireless charging system 100 may increase the amount of electrical energy delivered to the user device 104 (522). The wireless charging system 100 may increase the amount of electrical energy transmitted through the wireless transmitter 214 to charge the user device 104 when the difference in temperature exceeds the operating margin. For example, the wireless charging system 100 may increase the power output from 5 W to 10 W or 15 W. This prevents the user device 104 from working sub-optimally when the temperature is very cold.

The wireless charging system 100 may use a single or a combination of the one or more temperature regulation devices including the one or more blowers 130, 138, the one or more vents 132, 140 and/or the bypass valve 134 to increase or decrease the temperature of the user device 104 and/or the surface of the charging pad apparatus 108. For example, the wireless charging system 100 may initially control a single temperature regulation device to regulate the temperature but if the temperature of the user device 104 continues to exceed the optimal temperature range, the wireless charging system 100 may employ another temperature regulation device to mitigate the temperature difference more efficiently.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A charging apparatus for charging an electronic device within a vehicle, comprising:
    a first sensor configured to measure or detect a temperature of the electronic device;
    at least one of a blower, a bypass valve or a vent configured to adjust the temperature of the electronic device or a temperature of a surface of a charging pad;
    one or more pipes (i) disposed within or below the surface of the charging pad, (ii) surrounding a perimeter of the charging pad for charging of the electronic device, and (iii) configured to circulate a medium for the adjustment of the temperature of the electronic device or the temperature of the surface of the charging pad; and
    a processor coupled to the first sensor and the at least one of the blower, the bypass valve or the vent and configured to:
        determine that the temperature of the electronic device exceeds a first threshold temperature, and
        control the at least one of the blower, the bypass valve or the vent to control the circulation of the medium through the one or more pipes and increase or decrease the temperature of the electronic device or the temperature of the surface of the charging pad.

2. The charging apparatus of claim 1, wherein to determine that the temperature of the electronic device exceeds the first threshold temperature the processor is configured to determine that the temperature of the electronic device is greater than or equal to the first threshold temperature.

3. The charging apparatus of claim 2, wherein the at least one of the blower, the bypass valve or the vent is at least the blower, wherein to control the at least one of the blower, the bypass valve or the vent, the processor is configured to:
    activate the blower to circulate or move air, liquid or other gases through the one or more pipes to decrease the temperature of the electronic device or the temperature of the surface of the charging pad.

4. The charging apparatus of claim 2, wherein the at least one of the blower, the bypass valve or the vent is at least the bypass valve, wherein the bypass valve is connected to a heating, ventilation and air conditioning (HVAC) unit of the vehicle, wherein to control the at least one of the blower, the bypass valve or the vent, the processor is configured to:
    open the bypass valve to circulate air or refrigerant from the HVAC unit through the one or more pipes to decrease the temperature of the electronic device or the temperature of the surface of the charging pad.

5. The charging apparatus of claim 4, wherein to control the at least one of the blower, the bypass valve or the vent to increase or decrease the temperature of the electronic device or the temperature of the surface of the charging pad the processor is configured to increase a speed of the blower based on a difference between the temperature of the electronic device or the temperature of the surface of the charging pad and the first threshold temperature.

6. The charging apparatus of claim 1, wherein to control the at least one of the blower, the bypass valve or the vent to increase or decrease the temperature of the electronic device or the temperature of the surface of the charging pad the processor is configured to:
    decrease the temperature of the electronic device or the temperature of the surface of the charging pad when the temperature of the electronic device is greater than or equal to the first threshold temperature; and
    increase the temperature of the electronic device or the temperature of the surface of the charging pad when the temperature of the electronic device is less than a second threshold temperature, wherein the second threshold temperature is less than the first threshold temperature.

7. The charging apparatus of claim 1, wherein the at least one of the blower, the bypass valve or the vent is at least the vent, wherein the vent is configured to open, partially open or close to increase or decrease the temperature of the electronic device or the temperature of the surface of the charging pad.

8. The charging apparatus of claim 1, further comprising:
    a second sensor configured to measure or detect an ambient temperature of a surrounding environment;

wherein the processor is configured to control the at least one of the blower, the bypass valve or the vent to increase or decrease the temperature of the electronic device or the temperature of the surface of the charging pad based on the ambient temperature and the temperature of the electronic device.

9. A charging apparatus for charging an electronic device, comprising:
a first sensor configured to measure or detect a temperature of the electronic device;
at least one of a blower, a bypass valve or a vent configured to adjust the temperature of the electronic device or a temperature of a surface of a charging pad;
one or more pipes (i) disposed within or below the surface of the charging pad, (ii) surrounding a perimeter of the charging pad for charging of the electronic device, and (iii) configured to circulate a medium for the adjustment of the temperature of the electronic device or the temperature of the surface of the charging pad, and
a processor coupled to the first sensor and the at least one of the blower, the bypass valve or the vent and configured to:
determine that the temperature of the electronic device is greater than or equal to a maximum threshold temperature, and
control the at least one of the blower, the bypass valve or the vent to control the circulation of the medium through the one or more pipes and decrease the temperature of the electronic device or the temperature of the surface of the charging pad when the temperature of the electronic device is greater than or equal to the maximum threshold temperature.

10. The charging apparatus of claim 9, wherein the at least one of the blower, the bypass valve or the vent is at least the blower, wherein to control the at least one of the blower, the bypass valve or the vent, the processor is configured to:
activate the blower to circulate or move air, liquid or other gases through the one or more pipes to decrease the temperature of the electronic device or the temperature of the surface of the charging pad.

11. The charging apparatus of claim 10, wherein the processor is configured to activate the blower to circulate or move the air, the liquid or the other gases through the one or more pipes until the temperature of the electronic device is less than the maximum threshold temperature.

12. The charging apparatus of claim 9, wherein the at least one of the blower, the bypass valve or the vent is at least the bypass valve, wherein the bypass valve is connected to a heating, ventilation and air conditioning (HVAC) unit of the vehicle, wherein to control the at least one of the blower, the bypass valve or the vent, the processor is configured to:
open the bypass valve to circulate air or refrigerant from the HVAC unit through the one or more pipes to decrease the temperature of the electronic device or the temperature of the surface of the charging pad.

13. The charging apparatus of claim 12, wherein the processor is configured to:
partially close the bypass valve when the temperature of the electronic device is less than the maximum threshold temperature.

14. The charging apparatus of claim 9, further comprising:
a second sensor configured to measure or detect an ambient temperature of a surrounding environment;
wherein the processor is configured to control the at least one of the blower, the bypass valve or the vent to decrease the temperature of the electronic device or the temperature of the surface of the charging pad based on the ambient temperature and the temperature of the electronic device.

15. The charging apparatus of claim 9, wherein the processor is configured to:
determine that the temperature of the electronic device is less than or equal to a minimum threshold temperature; and
control the at least one of the blower, the bypass valve or the vent to control the circulation of the medium through the one or more pipes and increase the temperature of the electronic device or the temperature of the surface of the charging pad when the temperature of the electronic device is less than or equal to the minimum threshold temperature.

16. A method for adjusting a temperature of a charging pad within a vehicle, comprising:
measuring or detecting, by a temperature sensor, a temperature of the charging pad;
determining, by a processor, that the temperature of the charging pad is greater than a first threshold temperature or less than a second threshold temperature; and
decreasing, by the processor and using at least one of a blower, a bypass valve or a vent coupled to one or more pipes (i) disposed within or below a surface of a charging pad, (ii) surrounding a perimeter of the charging pad for charging a device, and (iii) configured to circulate a medium for the adjustment of the temperature of the charging pad, the temperature of the charging pad in response to the temperature of the charging pad being greater than the first threshold temperature.

17. The method of claim 16, further comprising:
increasing, by the processor and using the at least one of the blower, the bypass valve or the vent, the temperature of the charging device in response to the temperature of the charging device becoming less than the second threshold temperature.

18. The method of claim 17, wherein the second threshold temperature is less than the first threshold temperature.

19. The method of claim 17, further comprising:
obtaining, by the processor, an ambient temperature within the vehicle;
wherein increasing the temperature of the charging device is based on the ambient temperature within the vehicle.

20. The method of claim 16, further comprising:
obtaining, by the processor, an ambient temperature within the vehicle;
wherein decreasing the temperature of the charging device is based on the ambient temperature within the vehicle.

* * * * *